United States Patent
Shen et al.

(10) Patent No.: US 8,621,398 B2
(45) Date of Patent: Dec. 31, 2013

(54) AUTOMATIC LAYOUT CONVERSION FOR FINFET DEVICE

(75) Inventors: Jeng-Jung Shen, Kaoshiung (TW); Shao-Ming Yu, Zhubei (TW); Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 437 days.

(21) Appl. No.: 12/780,060

(22) Filed: May 14, 2010

(65) Prior Publication Data

US 2011/0283245 A1    Nov. 17, 2011

(51) Int. Cl.
*G06F 17/50* (2006.01)

(52) U.S. Cl.
USPC .............. 716/51; 716/52; 716/54; 716/55; 716/132

(58) Field of Classification Search
USPC .............. 716/51, 52, 54, 55, 106, 126, 132
See application file for complete search history.

(56) References Cited

U.S. PATENT DOCUMENTS

| | | | |
|---|---|---|---|
| 6,660,596 B2 * | 12/2003 | Adkisson et al. | 438/286 |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,315,994 B2 * | 1/2008 | Aller et al. | 716/106 |
| 7,491,589 B2 * | 2/2009 | Anderson et al. | 438/157 |
| 7,508,031 B2 | 3/2009 | Liu et al. | |
| 7,528,465 B2 | 5/2009 | King et al. | |
| 7,605,449 B2 * | 10/2009 | Liu et al. | 257/622 |
| 7,732,343 B2 * | 6/2010 | Niroomand et al. | 438/725 |
| 7,979,836 B2 * | 7/2011 | Anderson et al. | 716/136 |
| 2003/0145299 A1 * | 7/2003 | Fried et al. | 716/11 |
| 2005/0020015 A1 * | 1/2005 | Mathew et al. | 438/277 |
| 2005/0136582 A1 * | 6/2005 | Aller et al. | 438/197 |
| 2005/0153490 A1 | 7/2005 | Yoon et al. | |
| 2005/0272195 A1 * | 12/2005 | Bryant et al. | 438/212 |
| 2006/0183289 A1 * | 8/2006 | Anderson et al. | 438/286 |
| 2007/0059891 A1 * | 3/2007 | Furukawa et al. | 438/299 |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Thuan Do
*Assistant Examiner* — Brian Ngo
(74) *Attorney, Agent, or Firm* — Haynes and Boone, LLP

(57) ABSTRACT

A method for generating a layout for a FinFET device is disclosed. The method includes receiving an initial layout containing an active region that has an edge extending in a first direction. The method includes designating a portion of the layout as a first region. The first region contains the active region. The method includes designating an elongate portion of the first region as a second region that extends in the first direction. The method includes designating a different elongate portion of the first region as a third region that extends in the first direction and that is adjacent to the second region in a second direction perpendicular to the first direction. The method includes enlarging the active region if the edge of the active region falls inside the third region, and shrinking the active region if the edge of the active region falls outside the third region.

20 Claims, 9 Drawing Sheets

(56) References Cited

U.S. PATENT DOCUMENTS

| | | |
|---|---|---|
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2008/0042204 A1* | 2/2008 | Cheng et al. ............ 257/347 |
| 2008/0188080 A1* | 8/2008 | Furukawa et al. ........ 438/694 |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0187575 A1* | 7/2010 | Baumgartner et al. ...... 257/255 |
| 2010/0203734 A1 | 8/2010 | Shieh et al. |
| 2010/0264468 A1 | 10/2010 | Xu |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

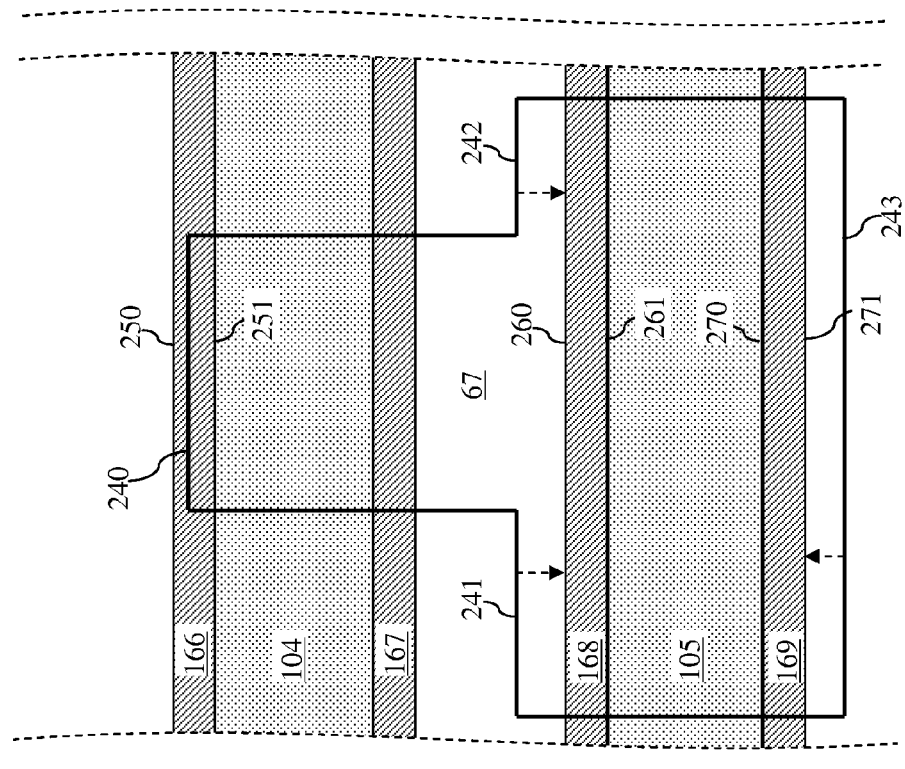
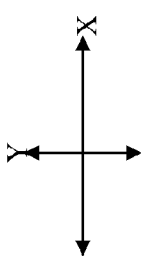
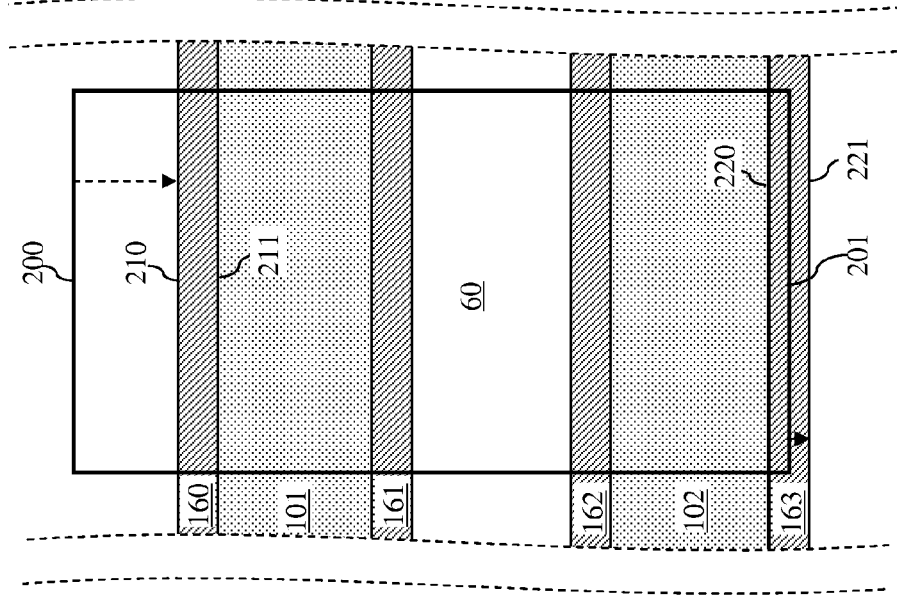
Fig. 7B
Fig. 7A

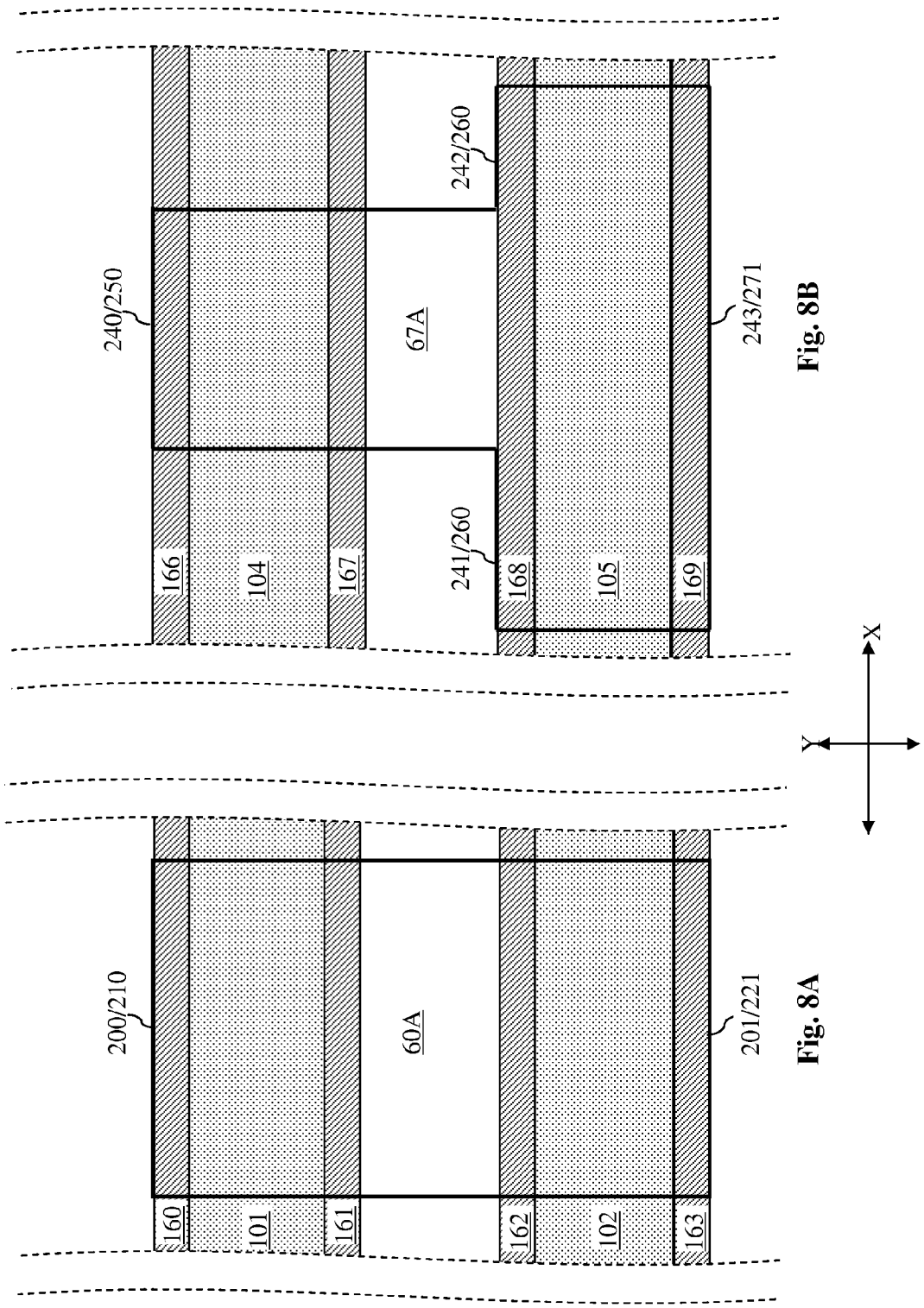

AUTOMATIC LAYOUT CONVERSION FOR FINFET DEVICE

FIELD OF THE INVENTION

The present disclosure relates generally to a semiconductor device, and more particularly, to the layout of a FinFET device.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

Fabrication of FinFET devices usually requires a computed-aided design (CAD) layer that defines the boundary of FinFET devices. This is done so that the FinFET devices can be fabricated in an area of a chip separate from traditional semiconductor devices (referred to as planar devices). When a semiconductor foundry receives a design layout from a customer, this FinFET boundary is usually not defined, since a customer may have implemented the layout of its chip using only planar devices. Consequently, the foundry may need to convert portions of the chip from a planar layout to a FinFET layout. However, this conversion process may violate a number of FinFET design rules.

Therefore, while existing methods of fabricating FinFET devices have been generally adequate for their intended purposes, they have not been entirely satisfactory in every aspect.

SUMMARY

One of the broader forms of the present disclosure involves a method of generating a layout for a semiconductor device. The method includes: receiving a first layout, the first layout including an active region that has a side; defining a portion of the first layout as a FinFET region, the FinFET region including the active region; defining in the FinFET region a plurality of elongate mandrel regions that each extend in a first direction and are spaced apart from one another in a second direction perpendicular to the first direction; defining in the FinFET region a plurality of pairs of elongate fin regions that each extend in the first direction and are separated in the second direction by a respective one of the mandrel regions; evaluating whether a condition has been met, where the condition is a function of a location of the side of the active region in relation to locations of the fin regions; resizing the active region if the evaluating reveals that the condition has been met; and generating a second layout using a layout-generating machine, the second layout including the resized active region.

Another one of the broader forms of the present disclosure involves a method of generating a layout for a semiconductor device. The method includes: receiving an initial layout plan of a semiconductor device, the initial layout plan containing an active region that has an edge extending in a first direction; designating a portion of the initial layout plan as a first region, the active region being disposed within the first region; designating an elongate portion of the first region as a second region, the second region extending in the first direction; designating a different elongate portion of the first region as a third region, the third region extending in the first direction, the third region being adjacent to the second region in a second direction perpendicular to the first direction; enlarging the active region if the edge of the active region is located inside the third region; and shrinking the active region if the edge of the active region is located outside the third region.

Yet another one of the broader forms of the present disclosure involves an apparatus that includes a non-transitory, tangible computer readable storage medium storing a computer program for modifying a layout of a semiconductor device, wherein the computer program has instructions that when executed, carries out: assigning a portion of the layout as a FinFET region, the FinFET region having an active region that includes a border extending substantially in a first direction; assigning a first portion of the FinFET region as a mandrel region, the mandrel region having a first elongate side that extends substantially in the first direction; assigning a second portion of the FinFET region as a fin region, the fin region having a second elongate side that extends substantially in the first direction and being abutted to the first elongate side; determining whether the border of the active region is located within the fin region; and varying a geometry of the active region in response to the determining.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-8 are diagrammatic fragmentary top views of a portion of a layout of a semiconductor device at different stages of layout generation in accordance with aspects of the present disclosure.

DETAILED DESCRIPTION

Figure 1:
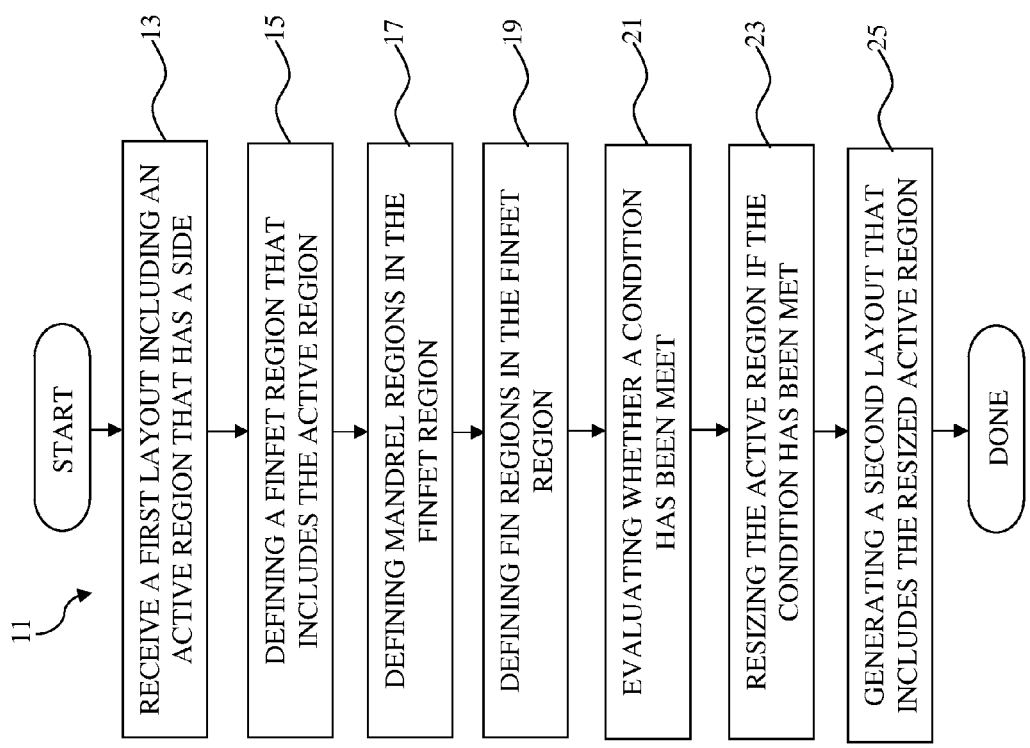
FIG. 1 is a flow chart of a method for generating a layout for a semiconductor device in accordance with aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

FIG. 1 is a flowchart of a method 11 for generating a layout for a semiconductor device in accordance with various aspects of the present disclosure. The method 11 begins with block 13 in which a first layout is received. The first layout has an active region. The active region has a side. The method 11 continues with block 15 in which a portion of the first layout is defined as a FinFET region. The FinFET region includes the active region. The method 11 continues with block 17 in which a plurality of elongate mandrel regions are defined in the FinFET region. The mandrel regions each extend in a first direction. The mandrel regions are spaced apart from one another in a second direction that is perpendicular to the first direction. The method 11 continues with block 19 in which a plurality of pairs of elongate fin regions are defined in the FinFET region. The fin regions each extend in the first direction. The fin regions are separated in the second direction by a respective one of the mandrel regions. The method 11 continues with block 21 in which a satisfaction of a condition is evaluated. The condition is a function of a location of the side of the active region in relation to locations of the fin regions. The method 11 continues with block 23 in which the active region is resized if the evaluating in block 21 reveals that the condition has been met. The method 11 continues with block 25 in which a second layout is generated. The second layout is generated using a layout-generating machine. The second layout includes the resized active region. It is understood that additional steps can be provided before, during, and after the method 11, and some of the steps described below can be replaced or eliminated, for additional embodiments of the methods.

The use of FinFET devices has been gaining popularity in the semiconductor industry. A FinFET device is a non-planar multi-gate transistor that is built on a substrate. A thin silicon "fin-like" structure (referred to as fin) forms the body of the FinFET. The gate of the FinFET device is wrapped around this fin. The source and drain of the FinFET are formed in extensions of the fin on opposite sides of the gate. The fin itself serves as a channel. The effective channel length of the FinFET device is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. However, the designer of the IC chip (e.g., a design house) may not have the necessary tools to perform the physical layout of the FinFET devices, or that it may be inconvenient for the designer to do so. Therefore, a designer of an IC chip may design a portion of the IC chip to be eventually implemented with FinFET devices, but may perform the initial physical layout of the IC chip using traditional planar MOSFET devices in place of FinFET devices.

The initial layout plan may be given to a different entity such as a foundry for fabrication. In accordance with an embodiment of the present disclosure, the foundry which may then convert the initial layout to a new layout such that the traditional planar devices may be converted into FinFET devices. A FinFET boundary region will be automatically defined/generated based on the initial layout. The initial layout plan may also contain a plurality of active regions in which FinFET devices are eventually to be formed. In accordance with embodiments of the present disclosure, geometries of these active regions in the initial layout are automatically adjusted to minimize FinFET design rule violations that may otherwise occur in the layout conversion process. The ensuing Figures and discussions explain this layout conversion process in greater detail.

Figure 2:
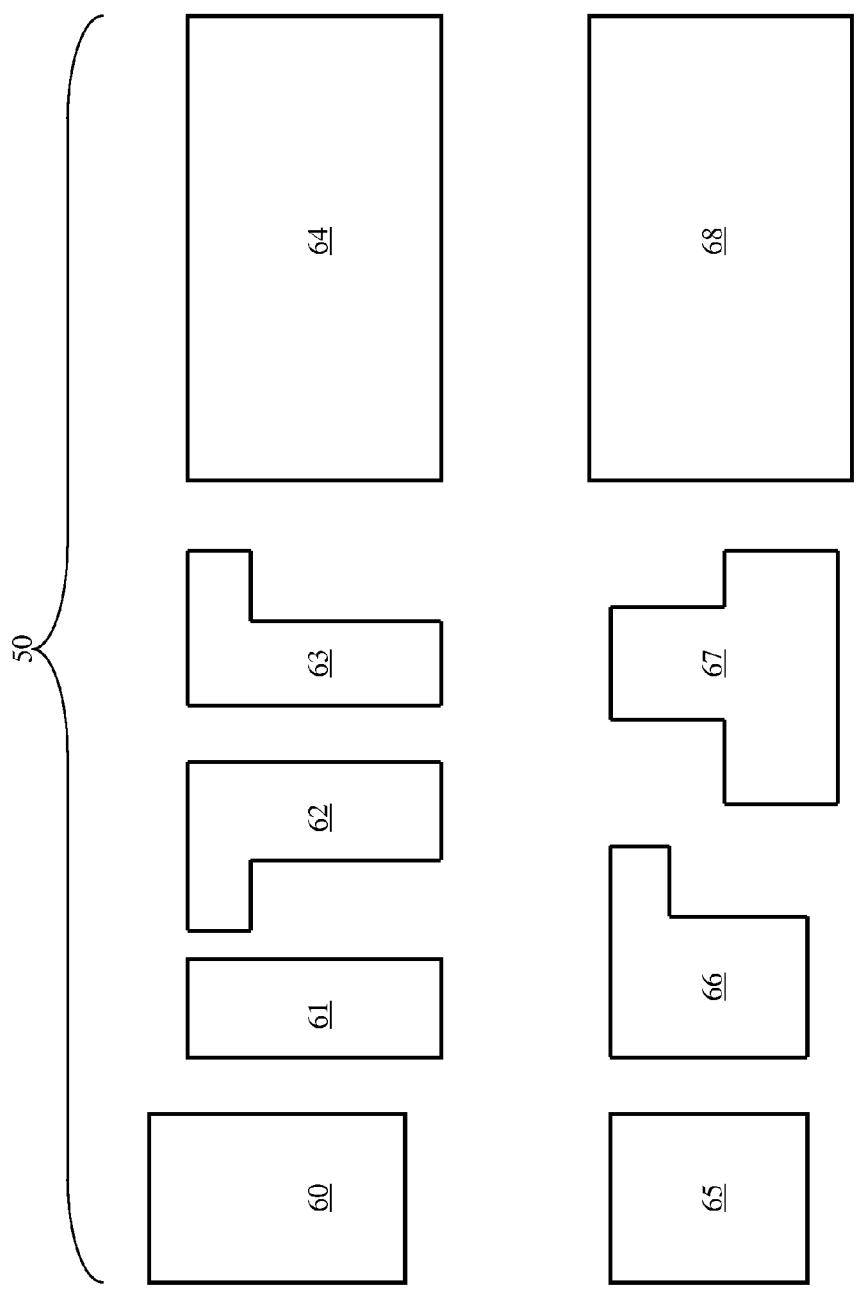

FIG. 2 illustrates a top view of a portion of an initial layout plan for an example semiconductor device. As discussed above, the initial layout plan may be provided by a design house. It is understood, however, that the initial layout plan may be generated by other entities such as a third party layout provider or even by the foundry itself. The initial layout plan includes a computer file (or virtual plan) that defines a physical layout of the example semiconductor device. The example semiconductor device may be an IC chip and may include millions of digital or analog transistors. The initial layout plan may also include multiple layers. For the sake of simplicity and clarity, only a portion 50 of the initial layout plan is shown herein. The portion 50 is a "snapshot" of a selected one or more layers of the initial layout plan within a predefined region of the initial layout plan.

As is shown in FIG. 2, the portion 50 includes a plurality of active regions 60-68. The active regions 60-68 are regions of a substrate where transistors (not illustrated) of the example semiconductor device will be formed. It is understood that the active regions 60-68 are merely examples for the sake of facilitating ensuing discussions, and that any number of other active regions may be included in the portion 50, and they may have shapes or geometries different from the active regions 60-68.

According to the initial layout plan, the transistors in the active regions 60-68 may have been designed to function as FinFET devices, but they may have been laid out as traditional planar transistor devices. To convert these planar transistor devices into FinFET devices, a region that is reserved for the formation of FinFET devices needs to be defined first. In other words, an area in the portion 50 of the initial layout plan needs to be specifically designated or assigned, so that FinFET devices will be formed in this area eventually. This region is thereafter referred to as a FinFET region.

The FinFET region is defined in a two-step process. First, referring to FIG. 3, virtual or temporary boundary lines are drawn around each of the active regions 60-68. Alternatively stated, the boundaries of each of the active regions 60-68 are "virtually moved" outwards, in both an X-direction and a Y-direction that is perpendicular to the X-direction. The X-direction extends horizontally in FIG. 2, and the Y-direction extends vertically in FIG. 2. For the sake of simplicity, the virtually moved boundaries are shown only for the active regions 60 and 68.

The boundaries of the active regions 60-68 are each virtually moved in this following manner: if a side of the active region extends in the X-direction, it will be virtually moved in the Y-direction; if a side of the active region extends in the Y-direction, it will be virtually moved in the X-direction.

The amount of virtual movement in the X-direction is approximately equal to a first number that is dependent on a fabrication process margin that may be process-specific. For a 32-nanometer (nm) technology process, the first number is approximately 0.03 microns (um). The amount of virtual movement in the Y-direction is approximately equal to a second number that is a function of several parameters including mandrel pitch, mandrel width, and fin width. These parameters will be illustrated in later drawings and will be discussed in more detail later. In an embodiment, the second number is approximately equal to: 2×(mandrel pitch)−½× (mandrel width)−(fin width). It is understood that the physical boundaries of the active regions 60-68 are not actually moved. The boundaries are "virtually moved" to help define the boundaries of the FinFET region.

After these virtual boundaries are generated for each of the active regions 60-68, a collective virtual boundary outline can be drawn around these active regions as a whole. The collective virtual boundary outline may have a somewhat irregular shape. For example, it may not be a perfect rectangle. As a second part of the FinFET region definition process, an irregularly-shaped collective virtual boundary outline is "rectangularized" to define a substantially rectangular boundary of the FinFET region.

Figure 3:
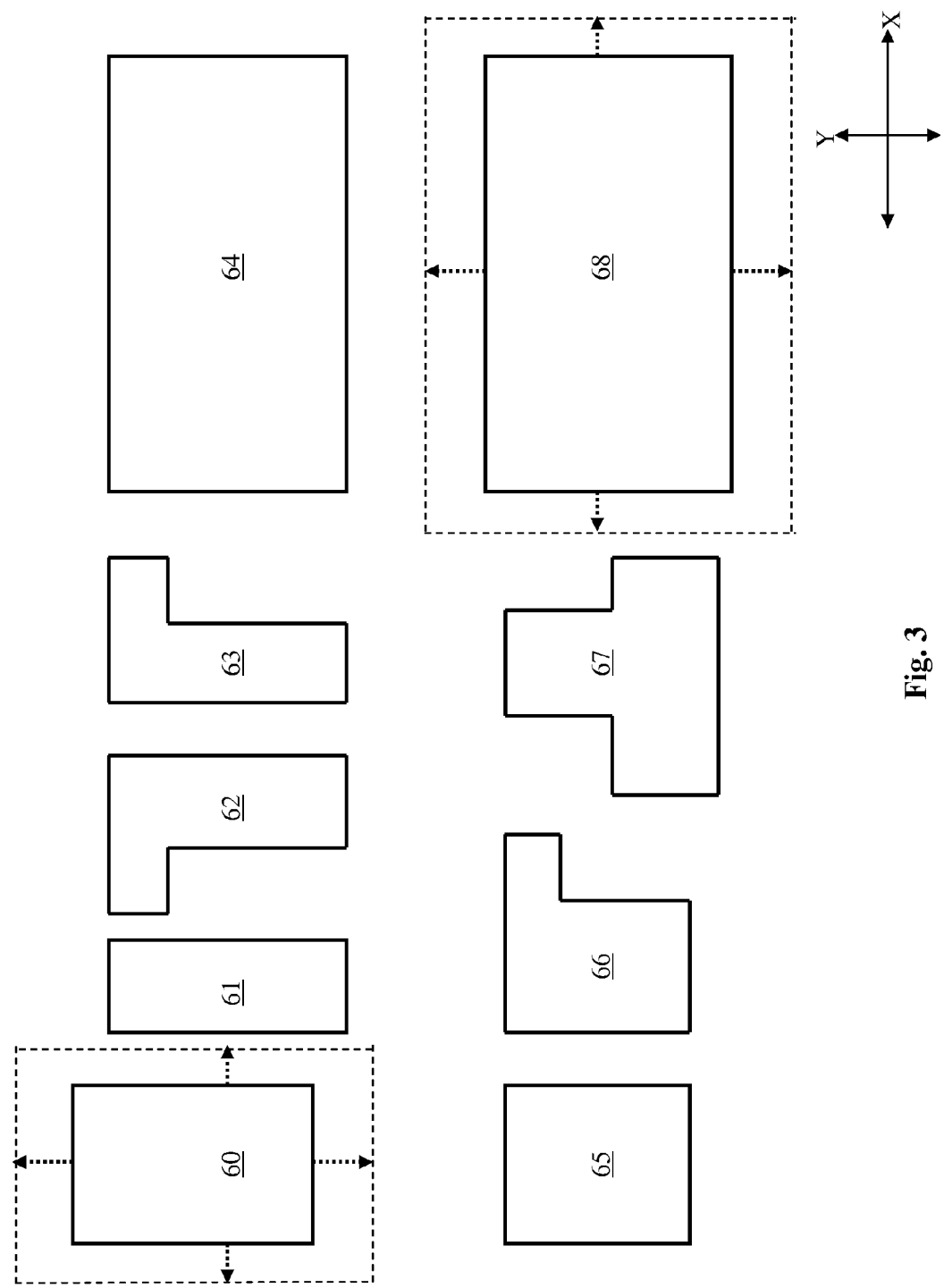
Figure 4:
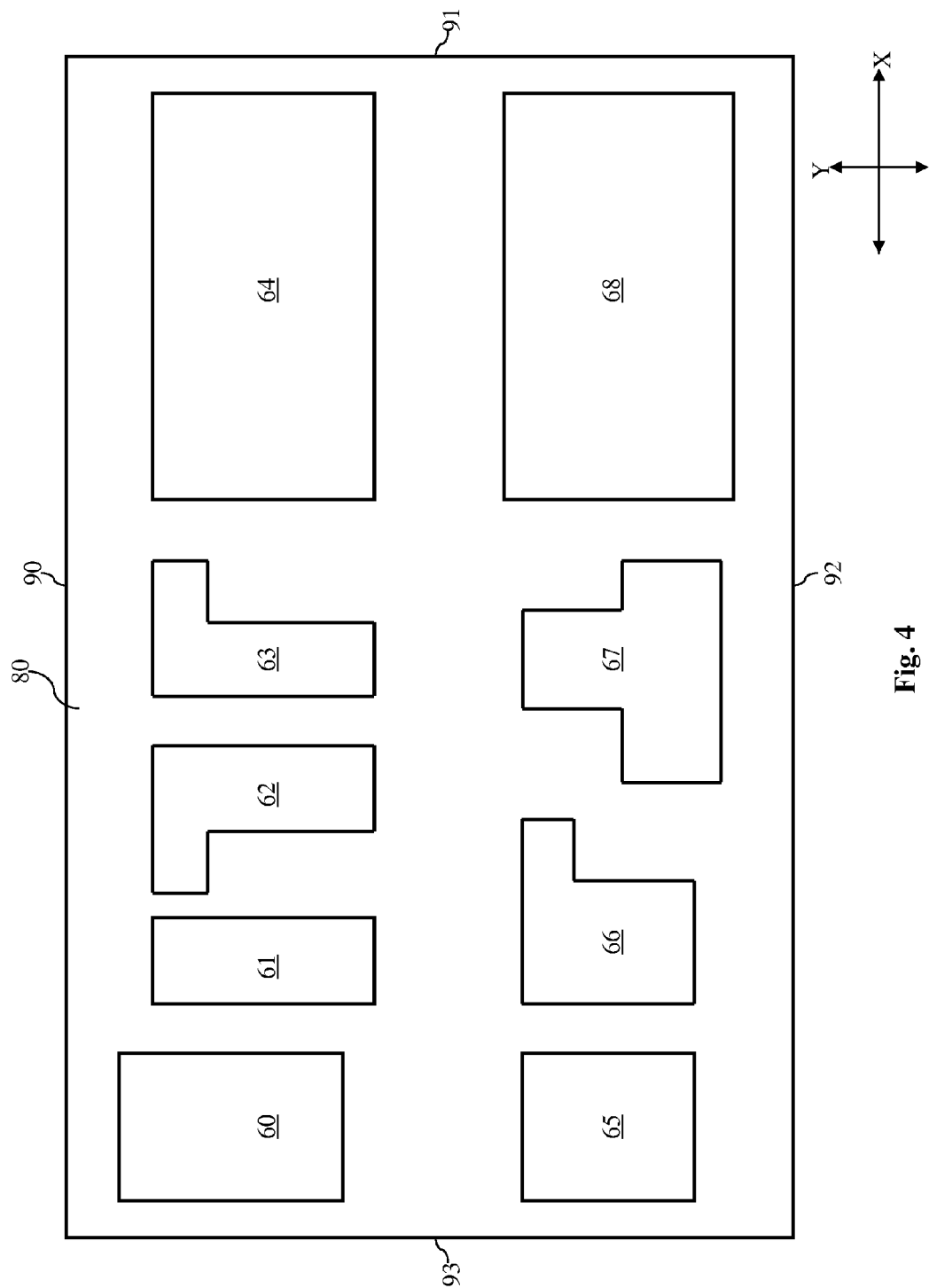

Referring to FIG. 4, this "rectangularized" FinFET region is labeled with the reference numeral 80. The active regions 60-68 are all located within the FinFET region 80. The FinFET region 80 has four sides (or edges) 90, 91, 92, and 93. The sides 90 and 92 each extend substantially in the X-direction. The sides 91 and 93 each extend substantially in the Y-direction. As discussed above in association with FIG. 3, the sides 91 and 93 are each spaced apart from the nearest active region (for example, the active region 64 and the active region 65, respectively) by the first number. Meanwhile, the sides 90 and 92 are spaced apart from the nearest active region (for example, the active region 60 and the active region 68, respectively) by the second number.

Figure 5:
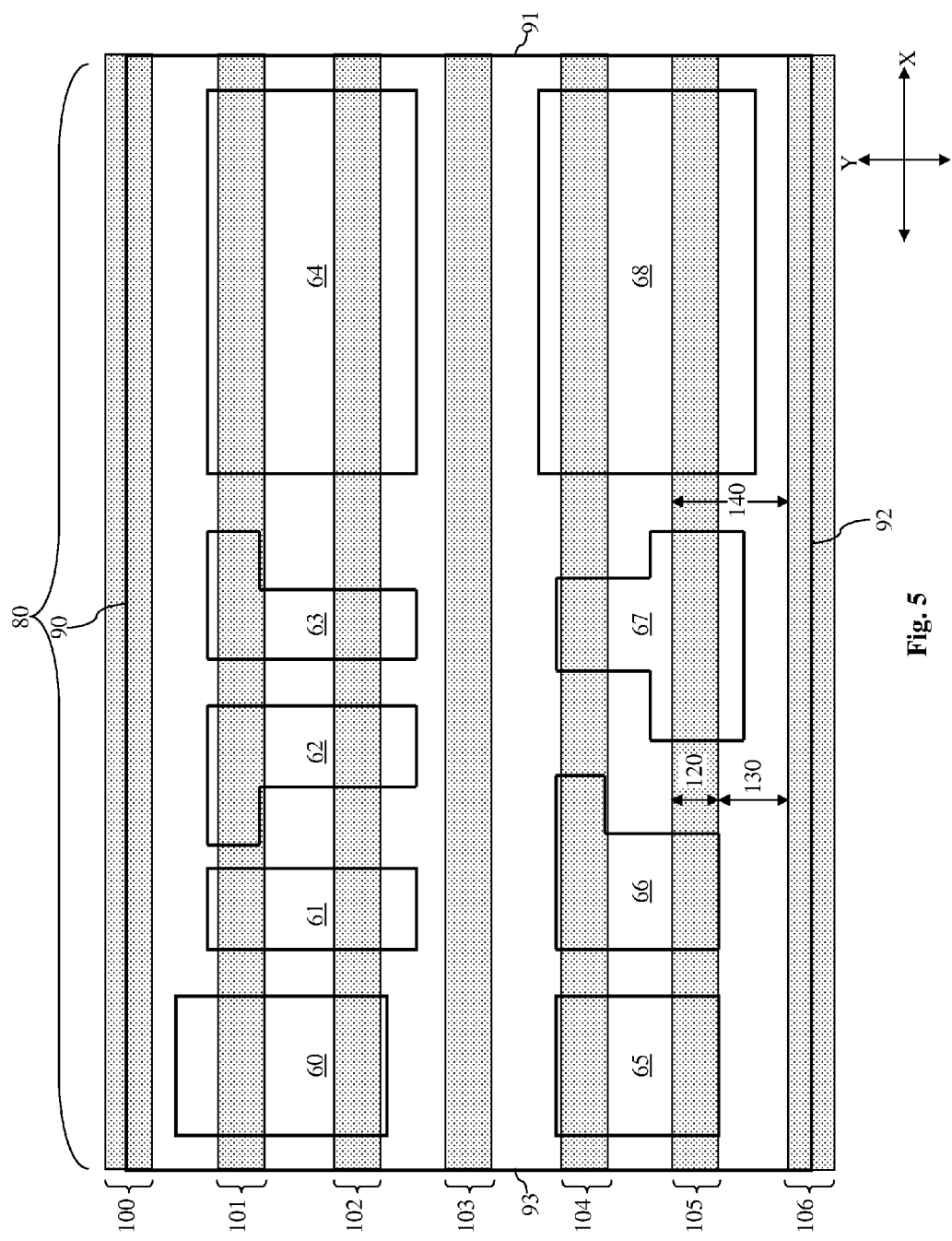

Referring now to FIG. 5, a plurality of elongate mandrel regions 100-106 are defined (or assigned/designated) in the FinFET region 80. The mandrel regions 100-106 are reserved for the formation of mandrels as part of the fabrication process for the FinFET devices in the FinFET region 80. In more detail, the mandrels serve as dummy layers and help define the fins of the FinFET devices. The mandrels will eventually be removed during the fabrication processing of the FinFET devices.

The mandrel regions 100-106 each extend substantially in the X-direction. The mandrel regions 100-106 also each have a width measured in the Y-direction and are spaced apart from one another in the Y-direction. In the embodiment shown in FIG. 5, the mandrel regions 100-106 all have equal widths 120 and are spaced apart evenly by a distance 130. In addition, the mandrel regions 100-106 have a pitch 140 that is a sum of the width 120 and the distance 130. The specific values of the width 120 and the distance 130 may vary depending on the fabrication process. For example, for a 32-nm technology process, the width 120 of the mandrel regions 100-106 is approximately equal to 40 nm, and the distance 130 separating the mandrels is approximately equal to 60 nm. Hence, the pitch 140 of the mandrel regions 100-106 is approximately equal to 100 nm. It is understood that in other embodiments, the mandrel regions 100-106 may each have a different width, and may be spaced apart unevenly, and may not extend substantially in the X-direction.

The mandrel regions 100-106 are defined in the following manner: the mandrel region 106 is defined first; then the mandrel region 105 is defined to be spaced apart from the mandrel region 106 by the distance 130; thereafter the mandrel region 104 is defined to be spaced apart from the mandrel region 105 by the distance 130, so on and so forth. Thus, the initial location of the "bottom-most" mandrel region 106 sets the locations of the rest of the mandrel regions 100-105.

As shown in FIG. 5, the mandrel region 100 is divided by the side 92 of the FinFET region 80. In an embodiment, the mandrel region 100 is substantially bisected (divided in the middle) by the side 92. It is understood that in another embodiment, the order of definition of the mandrel regions 100-106 may be reversed, so that the mandrel region 100 is defined first (and bisected by the side 90 of the FinFET region 80), and the mandrel regions 101-106 are thereafter defined in a similar manner.

Figure 6:
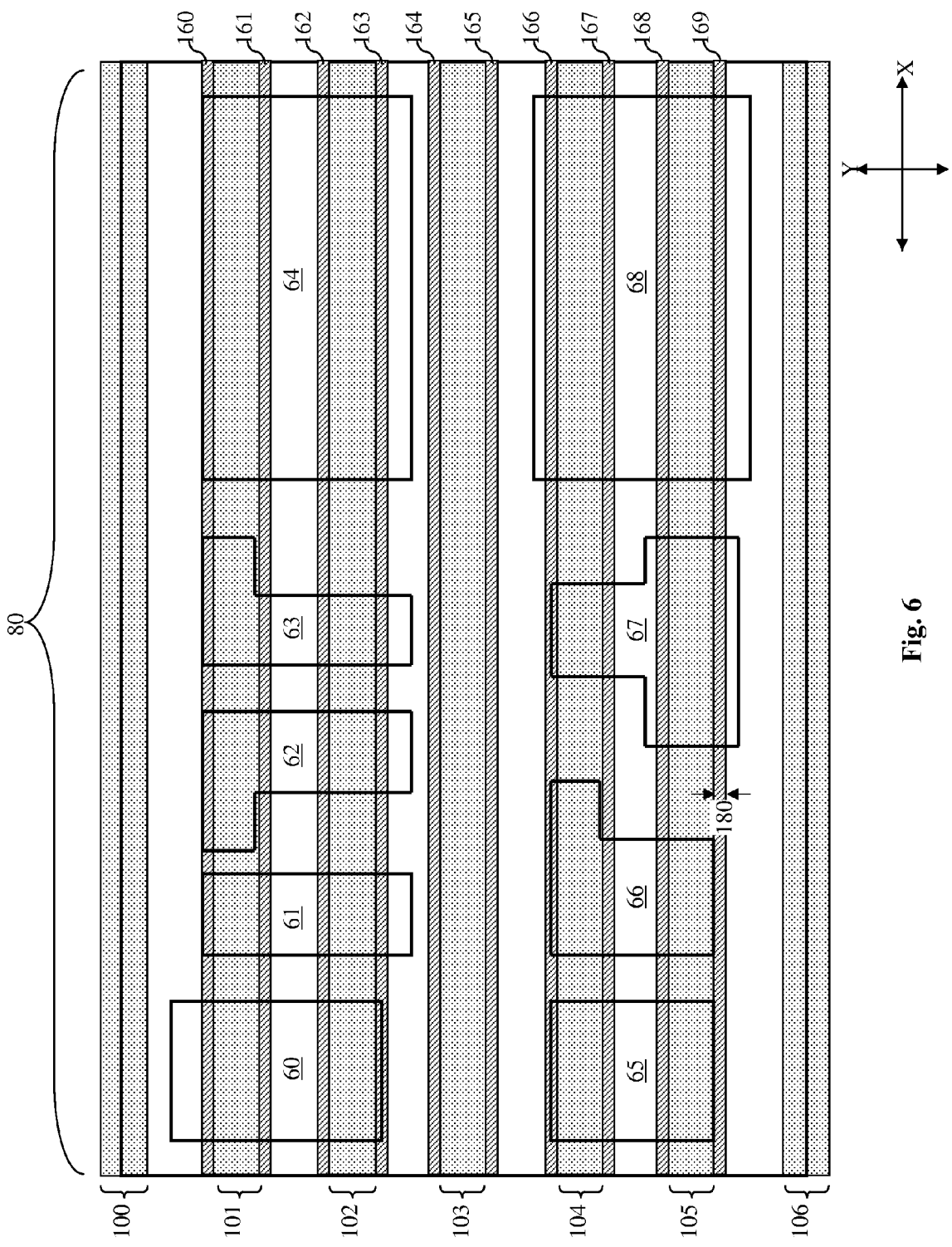

Referring now to FIG. 6, a plurality of elongate fin regions 160-169 are defined (or assigned/designated) in the FinFET region 80. Specifically, the fin regions 160-161 are defined to be adjacent to opposite sides of the mandrel region 101, the fin regions 162-163 are defined to be adjacent to opposite sides of the mandrel region 102, the fin regions 164-165 are defined to be adjacent to opposite sides of the mandrel region 103, the fin regions 166-167 are defined to be adjacent to opposite sides of the mandrel region 104, and the fin regions 168-169 are defined to be adjacent to opposite sides of the mandrel region 105.

The fin regions 160-169 each extend substantially in the X-direction and are spaced apart in the Y-direction. The fin regions 160-169 each have an elongate side that is abutted (bordering) to an elongate side of one of the respective mandrel regions 101-105 disposed therebetween. The fin regions 160-169 also each have a width measured in the Y-direction. In the embodiment shown in FIG. 5, the fin regions 160-169 all have equal widths 180. The specific value of the width 180 may vary depending on the fabrication process. For a 32-nm technology process, the width 180 of the fin regions 160-169 is approximately equal to 10 nm. It is understood that in other embodiments, the mandrel regions 160-169 may each have a different width, and may be spaced apart unevenly, and may not extend substantially in the X-direction.

Recall from the discussions associated with FIG. 3, the second number (used for the definition of the FinFET region—specifically, the virtual distance by which each active region 60-68 is moved in the Y-direction) is defined to be a function of the parameters mandrel width, mandrel pitch, and fin width. Now, with reference to FIGS. 5 and 6, the parameter mandrel width is the width 120 (shown in FIG. 5), the parameter mandrel pitch is the pitch 140 (shown in FIG. 5), and the parameter fin width is the width 180 (shown in FIG. 6). Thus, for a 32-nm technology process, the second number is approximately equal to 2×(the pitch 140)–½×(the width 120)–(the width 180)=2×100 nm–½×(40 nm)–10 nm=170 nm, or 0.17 um.

FIGS. 7A and 7B illustrate portions of FIG. 6 in more detail. In particular, FIG. 7A is a "zoomed-in" top view of the active region 60, and the mandrel regions 101-102 and the fin regions 160-163 nearby. FIG. 7B is a "zoomed-in" top view of the active region 68, and the mandrel regions 104-105 and the fin regions 166-169 nearby. FIGS. 7A and 7B help illustrate how the active regions 60-68 are resized in the process of converting a planar device layout into a FinFET device layout. The active regions 60-68 are resized to reduce or prevent FinFET design rule violations.

Referring to FIG. 7A, the active region 60 has a side 200 and a side 201 that each extend substantially in the X-direction. The sides 200-201 may also be referred to as edges or borders. The fin regions 160 and 163 have respective elongate sides 210-211 and 220-221 that also extend substantially in the X-direction. In this case, the side 200 falls outside of any of the fin regions 160-163. To avoid FinFET design rule violations, the active region 60 is truncated by moving the side 200 downwards in the Y-direction, until the side 200 is substantially aligned (or coincided) with the side 210 of the fin region 160. Stated differently, the active region 60 is truncated until the side 200 is substantially aligned with a side (210) of the fin region (160) that is nearest to the side 200.

The side 201 falls inside the fin region 163. To avoid FinFET design rule violations, the active region 60 is expanded by moving the side 201 downwards in the Y-direction, until the side 201 is substantially aligned with the side 221 of the fin region 163. Stated differently, the active region 60 is expanded until the side 201 is substantially aligned with a side (221) of the fin region (163) within which the side 201 is disposed.

Hence, the resizing of the active region 60 includes altering the geometry of the active region 60 by simultaneously increasing and decreasing its area. Whether the area of the active region 60 is increased or decreased depends on the initial location of the sides 200-201 of the active region in relation to the fin regions 160-163. In other words, how the active region 60 is resized depends on the satisfaction of a condition: if one of the sides 200 or 201 falls within any of the fin regions 160-163, the active region 60 is expanded; if one of the sides 200 or 201 falls outside all of the fin regions 160-163, the active region 60 is truncated. This resizing process ensures that the active region 60 is "on grid" when FinFET devices are eventually formed within the active region 60.

Referring to FIG. 7B, the active region 67 has sides 240, 241, 242, and 243 that all extend substantially in the X-direction. The fin regions 166, 168 and 169 have respective elongate sides 250-251, 260-261 and 270-271 that also extend substantially in the X-direction. In this case, the side 240 falls inside the fin region 166. To avoid FinFET design rule violations, the active region 67 is expanded by moving the side 240 upwards in the Y-direction, until the side 240 is substantially aligned (or coincided) with the side 250 of the fin region 163. The sides 241-243 each fall outside of any of the fin regions 166-169. To avoid FinFET design rule violations, the active region 60 is truncated by:

Moving the sides 241-242 downwards in the Y-direction, until the sides 241-242 are substantially aligned with the side 260 of the fin region 168.

Moving the side 243 upwards in the Y-direction, until the side 243 is substantially aligned with the side 271 of the fin region 169.

Hence, similar to was done for the active region 60, the resizing of the active region 67 includes altering the geometry of the active region 67 by simultaneously increasing and decreasing its area. Once again, the manner that the active region 67 is resized is dependent on the satisfaction of a condition—whether the sides 240-243 of the active regions fall within any of the fin regions 166-169. In other words, the area of the active region 67 is increased if the sides 240-243 are located within the fin regions 166-169, and the area of the active region 67 is decreased if the sides 240-243 are located outside the fin regions 166-169. This resizing process ensures that the active region 67 is "on grid" when FinFET devices are eventually formed within the active region 67.

FIGS. 8A and 8B are "zoomed-in" top view of the active regions 60 and 67 and nearby mandrel regions 101-102 and 104-105 as well as nearby fin regions 160-163 and 166-169, after the active regions 60 and 67 have been resized into active regions 60A and 67A, respectively. Alternatively stated, the FIGS. 8A and 8B are continuations of the FIGS. 7A and 7B, respectively, after the resizing operations have been performed. As shown in FIG. 8A, the side 200 of the active region 60A is now substantially aligned with the side 210 of the fin region 160. The side 201 of the active region 60A is now substantially aligned with the side 221 of the fin region 163. As shown in FIG. 8B, the side 240 of the active region 67A is now substantially aligned with the side 250 of the fin region 166. The sides 241-242 of the active region 67A are now substantially aligned with the side 260 of the fin region 168. The side 243 of the active region 67A is now substantially aligned with the side 271 of the fin region 169.

It is understood that the active regions 60 and 67 are shown here merely as examples. Other active regions (such as the active regions 61-66 and 68) undergo similar resizing operations to ensure that FinFET design rule violations are minimized. After all the active regions have been resized, a new layout is realized. The new layout can be used to fabricate FinFET devices. For example, as part of the FinFET fabrication process, the new layout can be used to construct photomasks having patterns that correspond to the patterns of the new layout.

Figure 9:
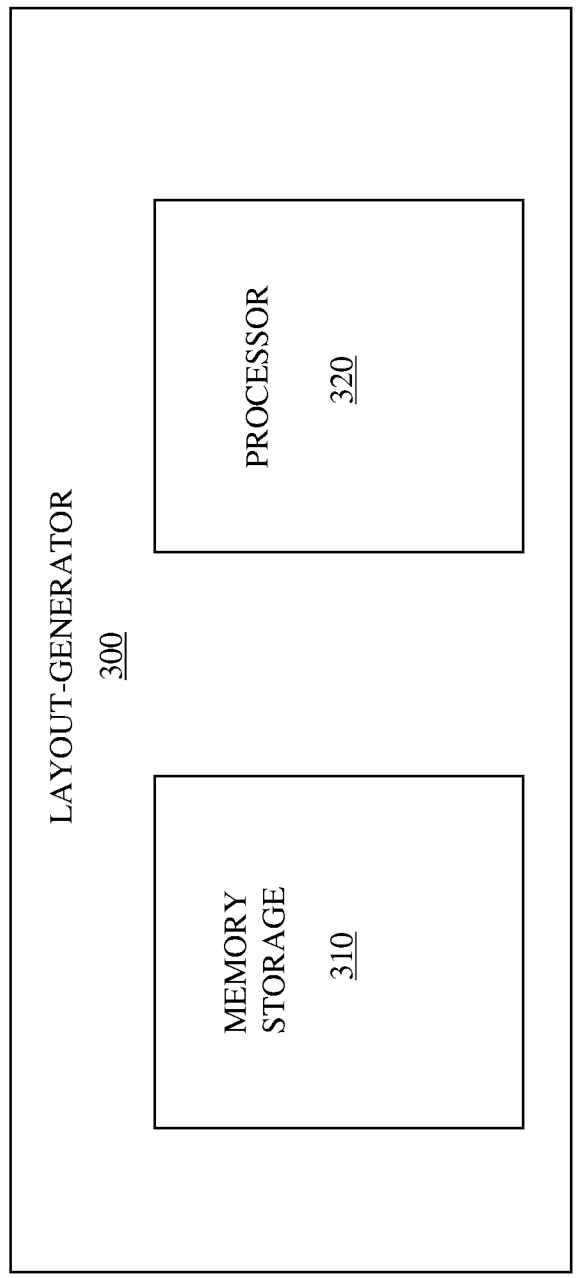
FIG. 9 is a simplified diagrammatic view of a machine that can be used to generate the layout in accordance with aspects of the present disclosure.

FIG. 9 is a simplified diagrammatic view of a layout-generator 300 (or layout-generating machine). The layout-generator 300 includes a machine or tool that can be used to perform the layout conversion process discussed above in association with FIGS. 2-8. In an embodiment, the layout generator 300 includes a memory storage component 310 and a processor component 320. The memory storage component 310 is a non-transitory, tangible computer readable storage medium. For example, the computer readable storage medium may include a hard drive or a CD-ROM. The computer readable storage medium may be implemented as part of a single work station or may be implemented as part of a centralized server.

The computer readable storage medium stores instructions that can be executed by the processor 320. These instructions contain algorithms used to carry out the various steps of converting an initial layout having planar devices to a layout having FinFET devices, as discussed above in association with FIGS. 2-8. In one embodiment, the instructions contain these following algorithms that may each be implemented as part of a computer program. One such algorithm is implemented to carry out assigning a portion of the initial layout as a FinFET region, the FinFET region having an active region that includes a border extending substantially in a first direction. Another algorithm is implemented to carry out assigning a first portion of the FinFET region as a mandrel region, the mandrel region having a first elongate side that extends substantially in the first direction. Yet another algorithm is implemented to carry out assigning a second portion of the FinFET region as a fin region, the fin region having a second elongate side that extends substantially in the first direction and being abutted to the first elongate side. One more algorithm is implemented to carry out determining whether the border of the active region is located within the fin region. An additional algorithm is implemented to carry out varying a geometry of the active region in response to the determining.

The instructions containing these algorithms are fetched to the processor component 320 for execution. After execution, the processor component 320 generates a new layout having FinFET devices. In other words, the planar devices from the initial layout are converted into the FinFET devices in the new layout through the execution of the instructions containing the above-mentioned algorithms. The new layout having FinFET devices may be stored in the memory storage component 310. It is understood that additional algorithms may be included in the instructions as part of this layout conversion process. These additional algorithms correspond to the various methods described above in association with FIGS. 2-8. It is also understood that the new layout having FinFET devices may be sent to a photomask fabricator so that photomasks corresponding to the new layout may be produced.

The embodiments of the present disclosure discussed herein offer several advantages, it being understood that other embodiments may offer different advantages, and that no particular advantage is required for any embodiment. For example, any given layout (such as a planar device layout) can be automatically converted into a FinFET device layout using the methods discussed herein. The entity (e.g. a design house) that generates the initial layout need not have the necessary tools to perform a FinFET layout and need not worry about meeting FinFET design rules. The entity (e.g. a foundry) that performs the above-described layout conversion will take care of the layout conversion from planar devices to FinFET devices in a seamless fashion. This enables the entity that generates the initial layout to have greater flexibility in performing the initial layout. Also, the converted layout will have minimal FinFET design rule violations, since the methods disclosed herein allow for "on grid" definition of active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout for a semiconductor device, comprising:
    receiving a first layout, the first layout including an active region that has a side;
    defining a portion of the first layout as a FinFET region, the FinFET region including the active region;
    defining in the FinFET region a plurality of elongate mandrel regions that each extend in a first direction and are spaced apart from one another in a second direction perpendicular to the first direction;
    defining in the FinFET region a plurality of pairs of elongate fin regions that each extend in the first direction and are separated in the second direction by a respective one of the mandrel regions;
    evaluating, by a computer, whether a condition has been met, where the condition is a function of a location of the side of the active region in relation to locations of the fin regions, wherein the condition is met if the side of the active region is completely disposed within one of the fin regions;
    resizing the active region if the evaluating reveals that the condition has been met, wherein the resizing includes expanding the active region in the second direction when the side of the active region is completely disposed within one of the fin regions such that the side of the active region is approximately aligned with an edge of the fin region within which the side was previously disposed, wherein the edge of the fin region remains stationary during the expanding of the active region in the second direction; and
    generating a second layout using a layout-generating machine, the second layout including the resized active region.

2. The method of claim 1, wherein:
    the evaluating is carried out in a manner so that the condition is met if the side of the active region is completely disposed outside any of the fin regions; and
    the resizing includes reducing the active region in a manner so that the side of the active region is approximately aligned with the edge of the fin region nearest to the side of the active region.

3. The method of claim 1, wherein the side of the active region is oriented to extend approximately in the first direction.

4. The method of claim 1, wherein the defining the mandrel regions is carried out in a manner so that at least one of the mandrel regions is substantially bisected by an edge of the FinFET region, the edge extending in the first direction.

5. The method of claim 1, wherein:
    the defining the mandrel regions is carried out in a manner so that:
        the mandrel regions have respective widths measured in the second direction; and
        the mandrel regions are spaced apart from one another in the second direction by respective distances; and
    the defining the fin regions is carried out in a manner so that:
        the fin regions have respective widths measured in the second direction; and
        the fin regions are contiguous with the respective mandrel regions disposed therebetween.

6. The method of claim 5, wherein:
    the widths of the mandrel regions are each equal to approximately 40 nanometers;
    the widths of the fin regions are each equal to approximately 10 nanometers; and
    the distances spacing apart the mandrel regions are each equal to approximately 60 nanometers.

7. The method of claim 5, wherein the defining the FinFET region is carried out in a manner so that an edge of the FinFET region is spaced apart in a second direction from the active region by a value that is equal to approximately: 2×(the width of one of the mandrel regions+one of the distances spacing apart the mandrel regions)−½×(the width of one of the mandrel regions)−(the width of one of the fin regions).

8. The method of claim 1, wherein the side of the active region is spaced apart from the edge of the fin region in the second direction prior to expanding the active region in the second direction.

9. The method of claim 1, wherein the defining the FinFET region is carried out in a manner so that an edge of the FinFET region is spaced apart in a second direction from the active region by a value that is equal to approximately: 2×(a width of one of the mandrel regions+one of a distances spacing apart the mandrel regions)−½×(the width of one of the mandrel regions)−(a width of one of the fin regions).

10. A method, comprising:
    receiving an initial layout plan of a semiconductor device, the initial layout plan containing an active region that has an edge extending in a first direction;
    designating a portion of the initial layout plan as a first region, the active region being disposed within the first region;
    designating, by using a computer, an elongate portion of the first region as a second region, the second region including a plurality of second regions extending in the first direction and spaced apart from one another in a second direction by respective distances, the second direction being substantially perpendicular to the first direction;
    designating a different elongate portion of the first region as a third region, the third region extending in the first direction, the third region being adjacent to one of the second regions in a second direction;
    enlarging the active region by moving the edge of the active region in the second direction if the edge of the active region is located inside the third region; and shrinking the active region if the edge of the active region is located outside the third region;
wherein the designating the portion of the initial layout plan as the first region is carried out in a manner so that an edge of the first region is spaced apart in the second direction from the active region by a value that is equal to approximately: 2×(a width of one of the second regions+one of the distances spacing apart the second regions)−½×(the width of one of the second regions)−(a width of the third region).

11. The method of claim 10, further including:
generating a new layout plan that contains one of: the enlarged active region and the shrunk active region; and
fabricating the semiconductor device using the new layout plan.

12. The method of claim 11, wherein the fabricating the semiconductor device includes generating a photomask based on the new layout plan.

13. The method of claim 10, wherein:
the designating the first region is carried out in a manner so that the first region is reserved for formation of a FinFET device;
the designating the second region is carried out in a manner so that the second region is reserved for formation of a mandrel associated with the FinFET device; and
the designating the third region is carried out in a manner so that the third region is reserved for formation of a fin of the FinFET device.

14. The method of claim 10, wherein the third region includes first and second edges that each extend in the first direction, and wherein:
the enlarging includes moving the edge of the active region in the second direction and away from the second region until the edge of the active region substantially coincides with one of the first and second edges of the third region; and
the shrinking includes moving the edge of the active region in the second direction and toward the third region until the edge of the active region substantially coincides with one of the first and second edges of the third region.

15. The method of claim 10, wherein the initial layout plan contains a plurality of further active regions that each have a respective further edge extending in the first direction; and wherein the designating the first region is carried out in a manner so that the first region contains a group of the further active regions; and further including, for each of the further active regions in the group:
enlarging the further active region if the further edge of the further active region is located inside the third region; and
shrinking the further active region if the further edge of the further active region is located outside the third region.

16. An apparatus comprising a non-transitory, tangible computer readable storage medium storing a computer program for modifying a layout of a semiconductor device, wherein the computer program has instructions that when executed, carry out:
assigning a portion of the layout as a FinFET region, the FinFET region having an active region that includes a border extending substantially in a first direction;
assigning a first portion of the FinFET region as a mandrel region, the mandrel region having a first elongate side that extends substantially in the first direction;
assigning a second portion of the FinFET region as a fin region, the fin region having a second elongate side that extends substantially in the first direction and being abutted to the first elongate side;
determining whether the border of the active region is located within the fin region; and
varying a geometry of the active region in response to the determining,
wherein the mandrel region is a first mandrel region, and the fin region is a first fin region, and wherein the computer program further includes instructions that when executed, carry out:
assigning a third portion of the FinFET region as a second mandrel region, the second mandrel region having a third elongate side that extends substantially in the first direction and being disposed away from the first mandrel region in the second direction; and
assigning a fourth portion of the FinFET region as a second fin region, the second fin region having a fourth elongate side that extends substantially in the first direction and being abutted to the third elongate side;
wherein the first and second mandrel regions each have a first width, and the first and second fin regions each have a second width, the first and second widths being measured in the second direction, and wherein the first width is greater than the second width.

17. The apparatus of claim 16, wherein:
the instructions for increasing the size are executed in a manner so that the border is aligned with the fin region in the first direction; and
the instructions for decreasing the size are executed in a manner so that the border is aligned with the mandrel region in the first direction.

18. The apparatus of claim 16, wherein the instructions for the varying the geometry includes:
instructions for increasing a size of the active region if the border of the active region is located within the fin region; and
instructions for decreasing the size of the active region if the border of the active region is located outside the fin region.

19. The apparatus of claim 16, wherein:
the instructions for the assigning the first and second mandrel regions are executed in a manner so that the first and second mandrel regions have a pitch measured in the second direction; and
the instructions for the assigning the FinFET region are executed in a manner so that the FinFET region has an edge that extends substantially in the first direction, and the edge is disposed away in the second direction from the border of the active region by: 2×(the pitch)−½×(the first width)−(the second width).

20. The apparatus of claim 19, wherein:
the instructions for the assigning the FinFET region are executed in a manner so that the FinFET region has a plurality of further active regions;
the instructions for the assigning the first and second mandrel regions are executed in a manner so that the pitch is equal to approximately 100 nanometers;
the instructions for the assigning the first mandrel and second mandrel regions are executed in a manner so that the first width is equal to approximately 40 nanometers; and
the instructions for the assigning the first and second fin regions are executed in a manner so that the second width is equal to approximately 10 nanometers.

* * * * *